US009840781B2

(12) United States Patent
Eissa et al.

(10) Patent No.: US 9,840,781 B2
(45) Date of Patent: Dec. 12, 2017

(54) PROCESS FOR NIFE FLUXGATE DEVICE (71) Applicant: Texas Instruments Incorporated, Dallas, TX (US)

(72) Inventors: Mona M. Eissa, Allen, TX (US); Yousong Zhang, Dallas, TX (US); Mark Jenson, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 320 days.

(21) Appl. No.: 14/557,546

(22) Filed: Dec. 2, 2014

(65) Prior Publication Data
US 2016/0155935 A1 Jun. 2, 2016

(51) Int. Cl.
| | |
|---|---|
| *C23F 1/28* | (2006.01) |
| *H01L 21/02* | (2006.01) |
| *G01R 33/04* | (2006.01) |
| *C09K 13/06* | (2006.01) |

(Continued)

(52) U.S. Cl.
CPC ............... *C23F 1/28* (2013.01); *C09K 13/06* (2013.01); *C23F 1/02* (2013.01); *G01R 33/04* (2013.01); *G03F 7/0005* (2013.01); *H01L 21/02107* (2013.01)

(58) Field of Classification Search
CPC . H01L 43/12; H01L 21/02107; G03F 7/0005; C23F 1/02; C23F 1/28; C09K 13/06; G01R 33/04
See application file for complete search history.

(56) References Cited

U.S. PATENT DOCUMENTS

| | | | |
|---|---|---|---|
| 6,562,251 B1 * | 5/2003 | Jordan ................ | G11B 5/3106 216/22 |
| 6,673,675 B2 | 1/2004 | Yates et al. | |

(Continued)

FOREIGN PATENT DOCUMENTS

SU 1089465 1 A 4/1984

OTHER PUBLICATIONS

Shah Umer et al. Permeability Enhancement by Multilayer Ferromagnetic Composites for Magnetic-Core O-Chip Inductors. IEEE Microwave and Wireless Components letters. Manuscript received Mar. 26, 2014; revised Jun. 24, 2014, p. 2 section "II Concept, Design and Fabrication", fig. 1.

*Primary Examiner* — Benjamin Sandvik
*Assistant Examiner* — Farid Khan
(74) *Attorney, Agent, or Firm* — Jacqueline J. Gamer; Charles A. Brill; Frank D. Cimino (57) ABSTRACT

An etchant for simultaneously etching NiFe and AlN with approximately equal etch rates that comprises phosphoric acid, acetic acid, nitric acid and deionized water. Alternating layers of NiFe and AlN may be used to form a magnetic core of a fluxgate magnetometer in an integrated circuit. The wet etch provides a good etch rate of the alternating layers with good dimensional control and with a good resulting magnetic core profile. The alternating layers of NiFe and AlN may be encapsulated with a stress relief layer. A resist pattern may be used to define the magnetic core geometry. The overetch time of the wet etch may be controlled so that the magnetic core pattern extends at least 1.5 um beyond the base of the magnetic core post etch. The photo mask used to form the resist pattern may also be used to form a stress relief etch pattern.

17 Claims, 10 Drawing Sheets (51) Int. Cl.
*C23F 1/02* (2006.01)
*G03F 7/00* (2006.01)

(56) References Cited

U.S. PATENT DOCUMENTS

| | | | |
|---|---|---|---|
| 2004/0007291 A1* | 1/2004 | Wood | C23C 8/02 |
| | | | 148/122 |
| 2004/0173570 A1 | 9/2004 | Ying et al. | |
| 2006/0213870 A1 | 9/2006 | Waldrop et al. | |
| 2007/0222441 A1* | 9/2007 | Satoh | G01R 33/04 |
| | | | 324/253 |
| 2009/0068761 A1* | 3/2009 | Lotfi | H01F 41/046 |
| | | | 438/3 |
| 2011/0240988 A1* | 10/2011 | Yano | H01L 29/78609 |
| | | | 257/43 |
| 2011/0316054 A1* | 12/2011 | Fedder | B81C 1/00246 |
| | | | 257/253 |
| 2012/0049193 A1* | 3/2012 | Saito | G02F 1/13454 |
| | | | 257/59 |
| 2015/0200112 A1 | 7/2015 | Han et al. | |
| 2015/0338474 A1 | 11/2015 | Mohan et al. | |

* cited by examiner

PROCESS FOR NIFE FLUXGATE DEVICE

FIELD OF THE INVENTION

This invention relates to the field of integrated circuits. More particularly, this invention relates to fluxgate magnetometers in integrated circuits.

BACKGROUND OF THE INVENTION

Some integrated circuits have a fluxgate magnetometer. A fluxgate magnetometer consists of a small, magnetically susceptible core wrapped by two coils of wire. An alternating electrical current is passed through one coil driving the coil through alternating cycles of magnetic saturation. The constantly reversing magnetic field in the core induces an electrical current in the second coil. In a magnetically neutral background, the input and output currents match. However, when the core is exposed to a background magnetic field, it will be more easily saturated in alignment with that field and less easily saturated in opposition to it. Hence the alternating magnetic field, and the induced output current, will be out of step with the input current. The extent to which they are out of step depends upon the strength of the background magnetic field. Typically the current in the output coil is integrated yielding an output analogy voltage which is proportional to the magnetic field.

Integrating the fluxgate magnetometer into the integrated circuit fabrication process requires forming a magnetic core of high permeability material such as permalloy (NiFe), with a thickness of a micron or more. To improve electrical properties the magnetic core may be formed of multiple, alternating layers of high permeability material and a dielectric material such as aluminium nitride (AlN). Finding an etch that etches a thick stack of multiple layers of two different materials with good dimensional control, with good profiles, and with insensitivity to material properties such as grain size is challenging.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An etchant for the simultaneous etching of NiFe and AlN with the same etching rate comprised of phosphoric acid, acetic acid, and nitric acid.

A method of forming a fluxgate magnetometer in an integrated circuit includes forming a magnetic core of the fluxgate magnetometer from alternating layers of permalloy and AlN dielectric. A wet etch containing phosphoric acid, acetic acid, nitric acid, and deionized water provides a good etch rate of the alternating layers with good dimensional control and with a good resulting magnetic core profile.

If desired, the alternating layers of NiFe and AlN may be encapsulated with a stress relief layer. A magnetic core photo resist pattern may be used to define the magnetic core geometry. The overetch time of the wet etch may be controlled so that the magnetic core pattern extends at least 1.5 um beyond the base of the magnetic core post etch. The photo mask used to form the magnetic core photo resist pattern may be used to form the stress relief material etch pattern.

DESCRIPTION OF THE VIEWS OF THE DRAWING

FIG. 3A through FIG. 3D are cross sections of the integrated circuit of FIG. 1 depicted in successive stages of fabrication.

FIG. 6A through FIG. 6C are cross sections of the integrated circuit of FIG. 5 depicted in successive stages of fabrication.

DETAILED DESCRIPTION OF EXAMPLE EMBODIMENTS

The following patent application is related and hereby incorporated by reference: US patent application Ser. No. 14/557,611, filed simultaneously with this application. With its mention in this section, this patent application is not admitted to be prior art with respect to the present invention.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit with a fluxgate magnetometer may be formed with a magnetic core composed of multiple, alternating layers of NiFe permalloy (NiFe) and AlN dielectric. The AlN layers between the layers of NiFe layers improve the performance of the magnetometer by reducing eddy current losses at high frequencies. The magnetic core may be composed of multiple alternating layers of NiFe and AlN with a thickness of 1 micron or more. The magnetic core may be composed of about 3 to 10 layers of the NiFe/AlN laminate. A good etched profile is difficult to achieve because of the difference in etching rate of NiFe and AlN in most etchants. A good profile is important to prevent voids between the magnetic core and overlying dielectric that might lead to delamination and circuit failure and also to reduce noise in the fluxgate magnetometer which may limit the sensitivity for the detection of weak magnetic fields. An etch has been developed that etches the multilayered stack of AlN and NiFe with an acceptable etch rate, with good dimensional control and with a good profile. The etch is insensitive to material properties such as grain size that may vary across the wafer, may vary from wafer-to-wafer, and may vary from lot-to-lot.

Figure 1:
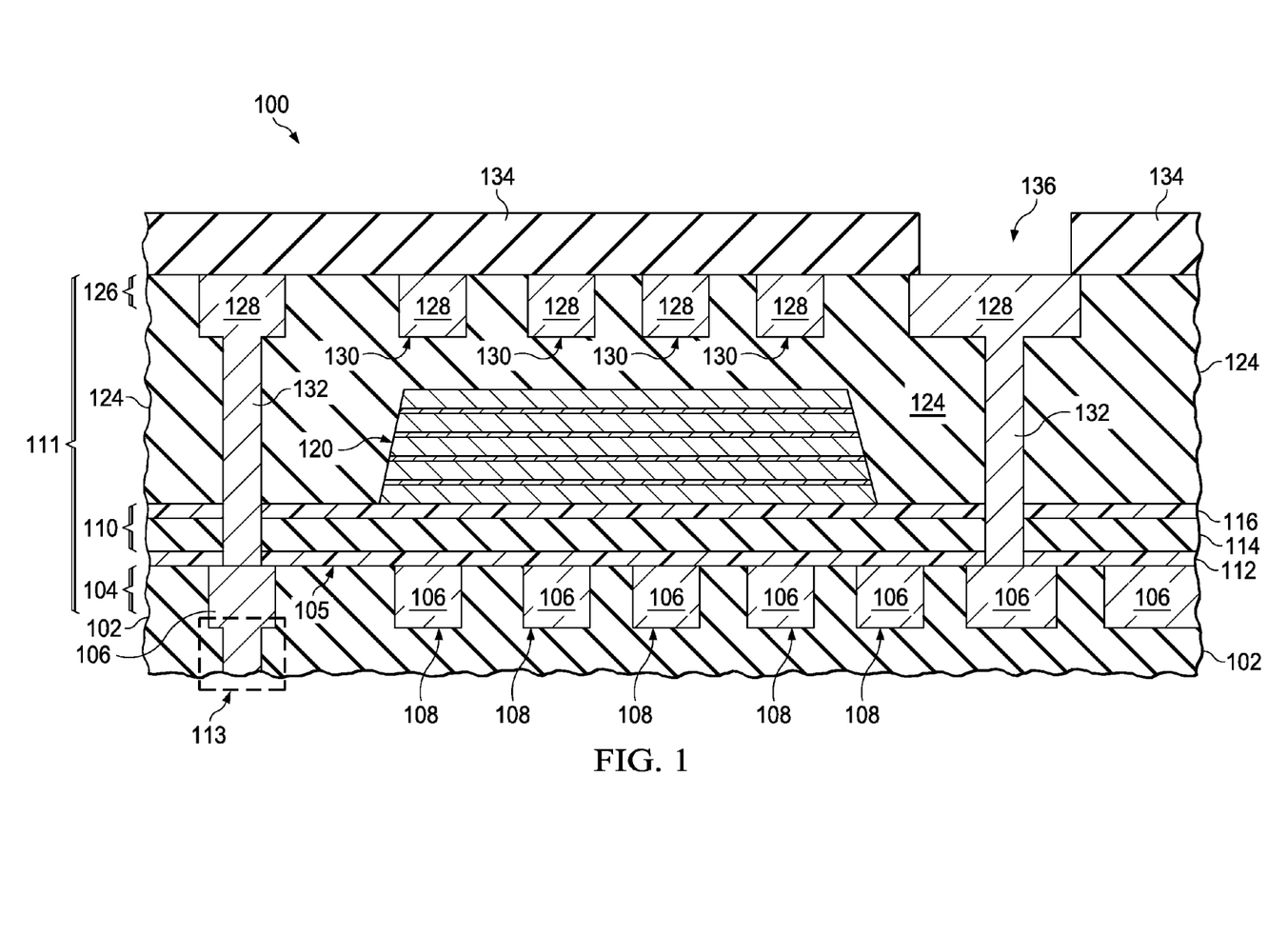
FIG. 1 is a cross section of an example integrated circuit containing a fluxgate magnetometer.

FIG. 1 is a cross section of an example integrated circuit 100 containing a fluxgate magnetometer 111. The fluxgate magnetometer 111 is comprised of a magnetic core 120 which is surrounded by a coil or multiple coils. The coil or coils are formed of a first set of metal lines 108 under the magnetic core 120 and a second set of metal lines 130 over the magnetic core that are coupled together with a first set of vias 213 (FIG. 2) that lie in front of the magnetic core 120 and a second set of vias 217 (FIG. 2) that lie behind the magnetic core 120. Vias 132 may also be used to form an electrical connection between first metal lines 104 to second metal lines 126. An underlying layer of dielectric 110 electrically isolates the magnetic core 120 from the first stet of metal lines 108. An overlying layer of dielectric 124 covers the sides and top of the magnetic core 120 and electrically isolates it from the vias 132, 213, and 217, and also electrically isolates is from the second set of metal lines 130. Although only one flux gate magnetometer sensor coil is shown, typically there may be two or more sensor coils.

The integrated circuit 100 includes a first interlevel dielectric (ILD) layer 102 which may include silicon dioxide-based material, such as organosilicate glass (OSG), silicon nitride, silicon oxynitride, and/or a low dielectric constant (low-k) dielectric. A plurality of first metal lines 104 having copper damascene structures are disposed in the first ILD layer 102, extending to a top surface 105 of the first ILD layer 102. Each instance of the first metal line 104 includes a refractory metal liner (not shown) of tantalum and/or tantalum nitride, and a fill metal 106 of copper on the metal liner. One or more of the first metal lines 104 may be connected to first vias 113 having copper damascene structures, disposed in the first ILD layer 102. Other of the first metal lines 108 may be formed under the magnetic core and become part of the flux magnetometer sensor coils. The first metal lines 104 and first vias 113 may be dual damascene structures as depicted in FIG. 1, or may be single damascene structures.

An underlying dielectric layer 110 is disposed on the first ILD layer 102 and on the first metal lines 104 and electrically isolates the first metal lines 104 from the magnetic core 120. The underlying dielectric layer 110 may be 500 to 1000 nm thick. The underlying dielectric layer 110 may include a first etch stop layer 112 over the first ILD layer 102 and over the first metal lines 104. The first etch stop layer 112 may be primarily silicon nitride-based dielectric material, 35 nanometers to 150 nanometers thick, which advantageously reduces copper migration from the first metal lines 104. Dielectric layer 114 which is formed on the first etch stop layer 112 may be a silicon dioxide layer 500 to 1000 nm thick formed by PECVD using tetraethyl orthosilicate, also known as tetraethoxysilane (TEOS). An optional second etch stop layer 116 may be formed over the dielectric layer 114. The second etch stop layer 116 may be primarily a silicon nitride-based dielectric material, 50 nanometers to 150 nanometers thick, and may be formed to provide an etch stop for subsequent etching steps.

A magnetic core 120 is formed on top of the underlying dielectric layer 110. The magnetic core 120 material is a multilayered stack of alternating layers of NiFe permalloy (NiFe) which is a material with high magnetic permeability and low resistance, and AlN which is a dielectric. In an example fluxgate magnetometer 111 the magnetic core is comprised of 3 to 10 layers of NiFe and AlN wherein the NiFe layers and the AlN layers alternate and wherein the NiFe layers have a thickness of about 225 nm to 425 nm and the AlN layers have a thickness of about 5 nm to 15 nm.

A second ILD layer 124 is disposed over the underlying dielectric layer 110 and over the sides and top of the magnetic core 120. The thickness of the second ILD layer 124 depends upon the thickness of the magnetic core 120. The thickness of the second ILD layer 124 may have a thickness between about 1 micron and 4 microns depending upon the thickness of the magnetic core 120. In an example fluxgate magnetometer the thickness of the magnetic core is about 1.4 microns and the thickness of the second ILD layer is about 3.5 microns of silicon dioxide deposited using a PECVD TEOS process.

A plurality of second vias 132 having copper damascene structures are disposed in the second ILD layer 124. Some of the second vias 132 extend through the underlying dielectric layer 110 and make connections to the first metal lines 104. The second vias 132 may be part of dual damascene structures which include second metal lines 126 over the second vias 132, as depicted in FIG. 1. The integrated circuit 100 may include an protective overcoat layer 134 disposed over the second ILD layer 124 and over the second metal lines 126 with a bond pad opening 136 for making electrical connection as shown in FIG. 1. Alternatively the integrated circuit may include a third etch stop layer disposed over the second ILD layer 124 and second metal lines 126 and possibly a third ILD layer over the third etch stop layer. Additional layers of ILD and interconnect may be formed between the second metal lines and a bond pad opening 136.

The second metal leads 130 above the magnetic core 120 are connected to the first metal leads 108 under the magnetic core 120 by a first set of vias 132 disposed in front of the magnetic core 120 and by a second set of vias 132 disposed behind the magnetic core 120. These vias 132 connect the first metal leads 108 to the second metal leads 130 to form a coil 212 (in FIG. 2) which winds around the magnetic core 214. The first metal leads 108 may be connected to the second metal leads 130 to form more than one coil surrounding the magnetic core 120. The coils are electrically isolated from the magnetic core 120 and the second vias 132 by the underlying first dielectric 110 and by the second ILD layer 124.

Figure 2:
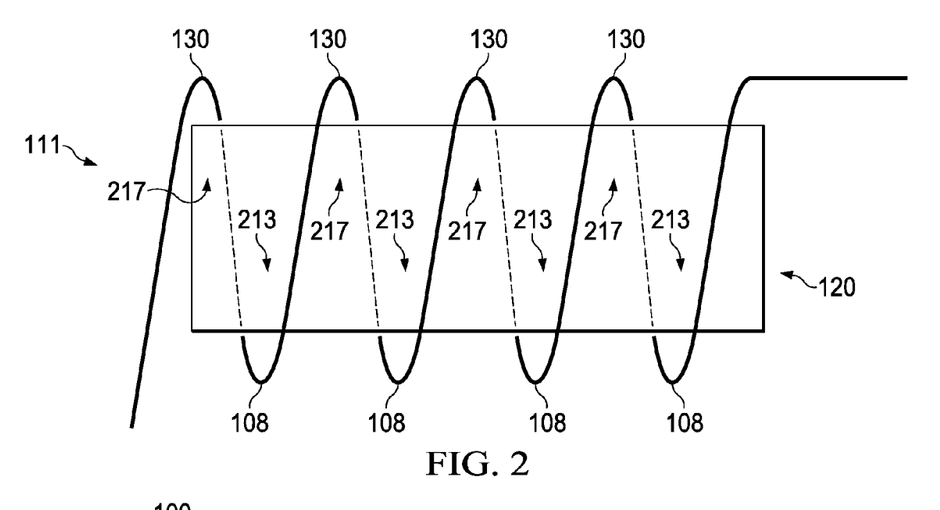
FIG. 2 is a diagram of a fluxgate magnetometer.

As is additionally illustrated in FIG. 2, first metal leads 108 underlying the magnetic core 120 are connected to the second metal leads 130 overlying the magnetic core 120 by vias 213 in front of the magnetic core 120 and by vias 217 behind the magnetic core 120. Although only one coil 212 is shown, two or more coils are typically formed around the magnetic core 120 to form the fluxgate magnetometer 111.

FIG. 3A through FIG. 3D are cross sections of the integrated circuit of FIG. 1 depicted in successive stages of fabrication.

Figure 3A:
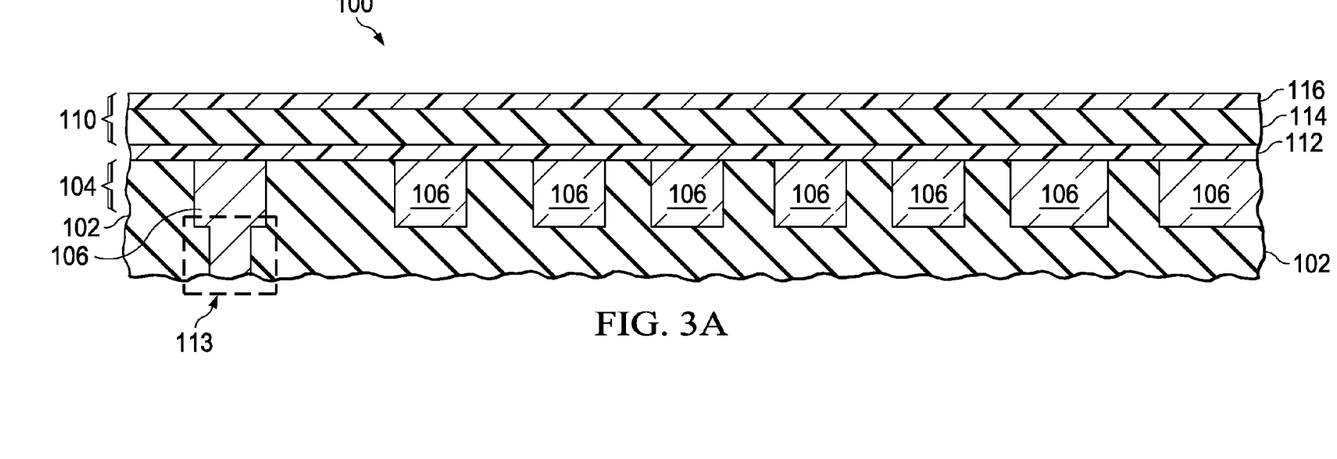

Referring to FIG. 3A, the underlying dielectric layer 110 is formed over lower layers including a substrate of the integrated circuit 100. The underlying dielectric layer 110 may be formed of layers of different dielectric materials. A first dielectric layer 112 in the underlying dielectric layer stack 110 may be an etch stop layer 112 formed on first ILD layer 102 and on first metal leads 104. The first etch stop layer 112 may be silicon nitride with a thickness of between about 35 nm and 150 nm and may be formed by PECVD using silane, ammonia and nitrogen gases, to provide desired etch selectivity to subsequently formed overlying layers of silicon dioxide-based dielectric materials. The first dielectric layer 112 also advantageously provides a diffusion barrier to copper 106 in the underlying first metal leads 104.

The second dielectric layer 114 in the underlying dielectric stack 110 may be a silicon dioxide-based dielectric material about 500 nm to about 1000 nm thick formed by plasma enhanced chemical vapor deposition (PECVD) using tetraethyl orthosilicate, also known as tetraethoxysilane (TEOS), or other suitable process.

A third dielectric layer 116 in the underlying dielectric stack 110 may be an optional second etch stop layer 116. The second etch stop layer 116 may be silicon nitride with a thickness between about 35 nm and 150 nm formed by PECVD using silane, ammonia and nitrogen gases, and may provide desired etch selectivity to a subsequent etch.

Figure 3B:
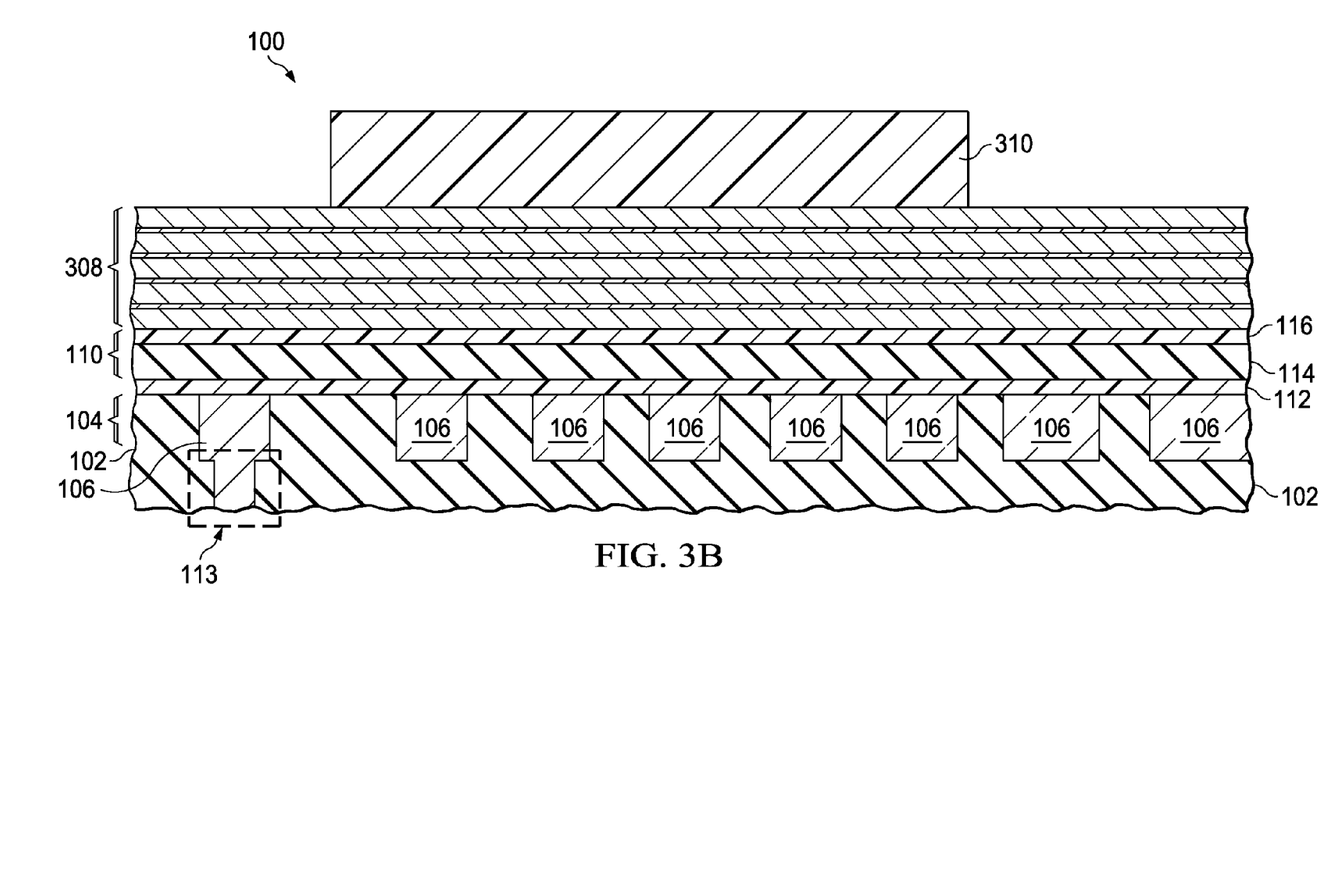

Referring to FIG. 3B a magnetic core material layer 308 is formed on the underlying dielectric layer 110. The magnetic core material layer 308 is composed of alternating layers of NiFe and AlN. A NiFe layer has a thickness of about 225 nm to 425 nm and a AlN layer has a thickness of about 5 nm to 15 nm. In an example embodiment the NiFe layer thickness is about 325 nm and the AlN layer thickness is about 10 nm. In the example embodiment the magnetic core is a stack of about 3 to 10 layers of AlN/NiFe. The AlN layers interposed between the NiFe layers improve performance of the fluxgate magnetometer by reducing losses due to eddy currents especially at high frequencies. A magnetic core pattern 310 is formed over the magnetic core material layer 308 and exposes the magnetic core material layer 308 where it is to be etched away. The magnetic core pattern 310 may include photoresist formed by a photolithographic process, and may possibly include an anti-reflection layer and/or a hard mask layer.

Figure 3C:
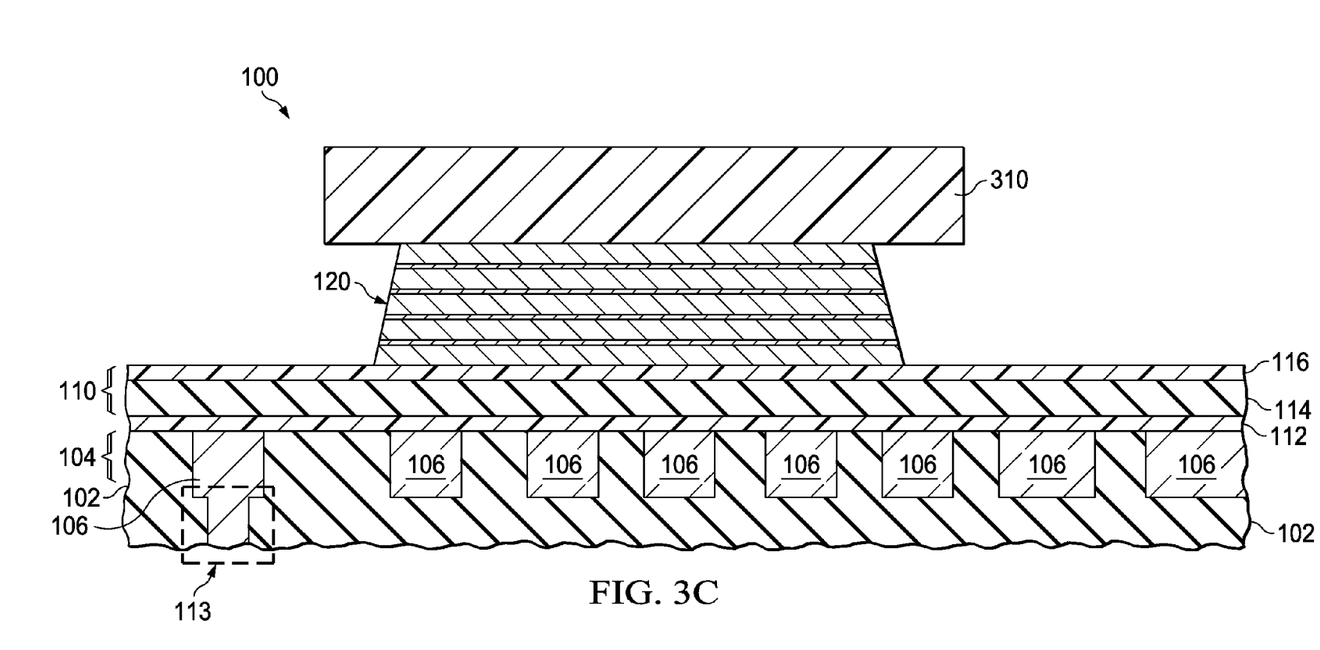

Referring to FIG. 3C, the magnetic core material layer 308 is etched from the regions exposed by the magnetic core pattern 310 to form the magnetic core 120.

A wet etchant which etches the stack of magnetic core material 308 resulting in good dimensional control and a good profile contains phosphoric acid, acetic acid, nitric acid, and deionized (DI) water. The wet etchant is composed of between about 20-40 wt % concentrated phosphoric acid, between about 1-10 wt % concentrated acetic acid, between about 0.1% and 3% concentrated nitride acid, and between about 20 and 80% wt % DI water. The wet etchant may be used in a temperature range of about 20° C. to 35° C. Etching time depends upon the temperature. The etch rate is faster at higher temperatures so etch time is shorter at higher temperatures. The preferred composition of the wet etchant depends upon the relative thickness of the NiFe and AlN layers. In an example fluxgate magnetometer the wet etchant is about 30% by weight phosphoric acid, about 4% by weight acetic acid and about 0.45% by weight nitric acid. This etchant etches the NiFe and the AN at approximately the same rate to provide a magnetic core with a good profile. Unlike other etchants which typically etch the NiFe and AlN at different rates resulting in a profile where the AlN layers protrude beyond the NiFe layers, this etchant results in a magnetic core profile where the edges of the AlN layers and the NiFe layers are substantially collinear. A smooth profile provides improved mechanical stability between the dielectric that overlies the magnetic core thus avoiding delamination that may result in circuit failure. The smooth profile also reduces noise which might limit the sensitivity of the magnetic core in the detection of weak magnetic fields.

Figure 3D:
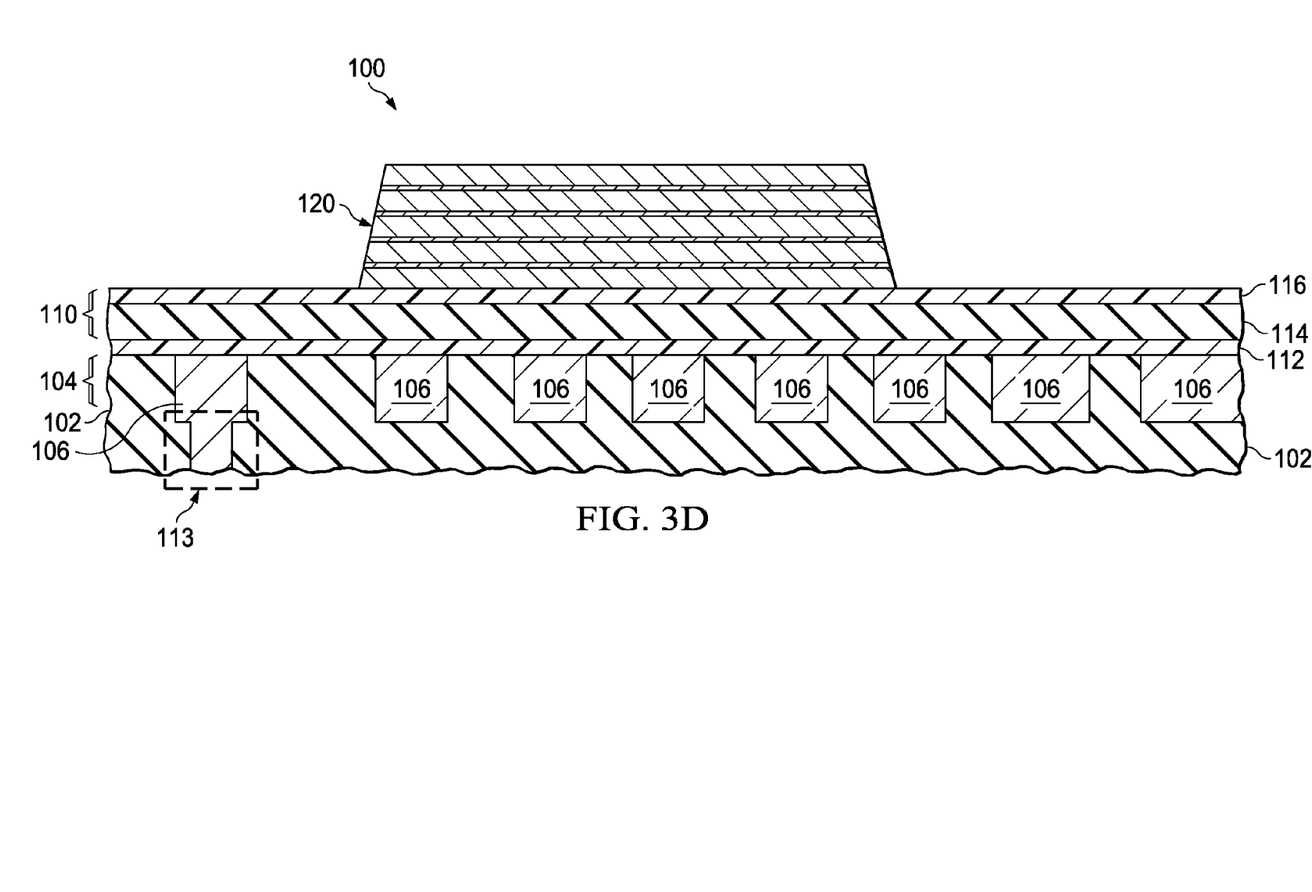

Referring to FIG. 3D, after the magnetic core pattern 310 is removed, fabrication of the integrated circuit 100 is continued to provide the fluxgate magnetometer 111 structure of FIG. 1.

When the magnetic core material stack 308 is thick, the etch rate of the magnetic core material may start slowing when etching time exceeds about 4 minutes. The etch rate may be restored by performing a DI rinse and then returning the wafers to the wet etchant bath such as is described in the process flow of FIG. 4.

Figure 4:
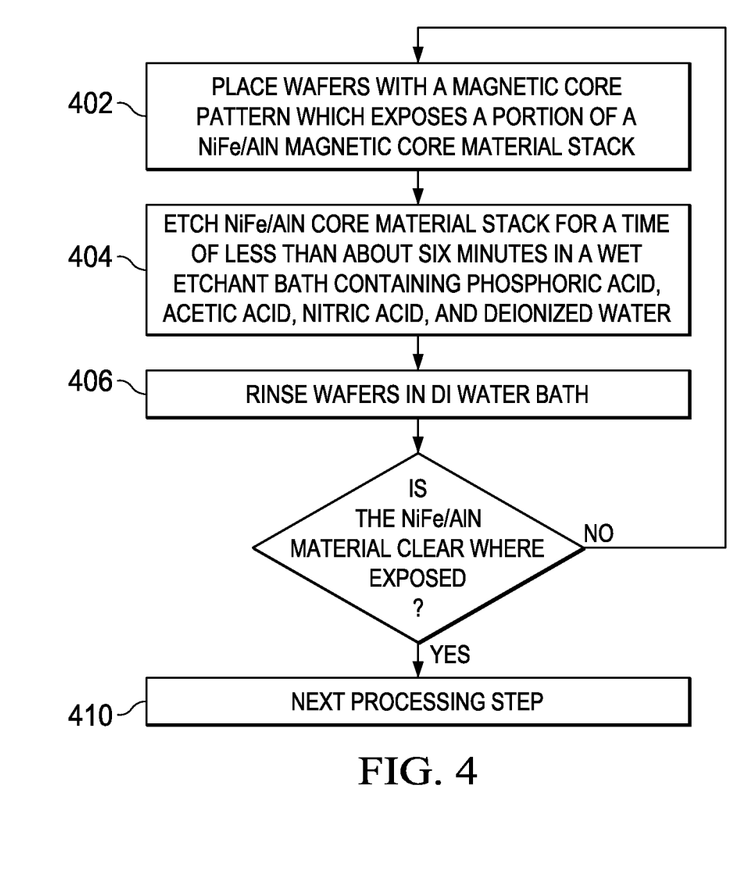
FIG. 4 is a flow diagram describing a procedure for etching the magnetic core with the wet etchant.

Referring to FIG. 4 the wafers with the patterned NiFe/AlN magnetic core material are put in the etchant bath described above in step 402 and etched for a time of less than about 6 minutes in step 404. In an example process the wafers are etched for about 4 minutes.

In step 406 the wafers are rinsed with DI water and in step 408 the wafers are checked to see if the NiFe/AlN magnetic core material is cleared from the regions exposed by the magnetic core pattern. If it is clear, the wafers are moved onto the next process step 410 in the process flow.

If the NiFe/AlN magnetic core material is not clear, the wafers are returned to the etching bath 402 and steps 402, 404, and 408 are repeated until the magnetic core material is etched clear.

Figure 5:
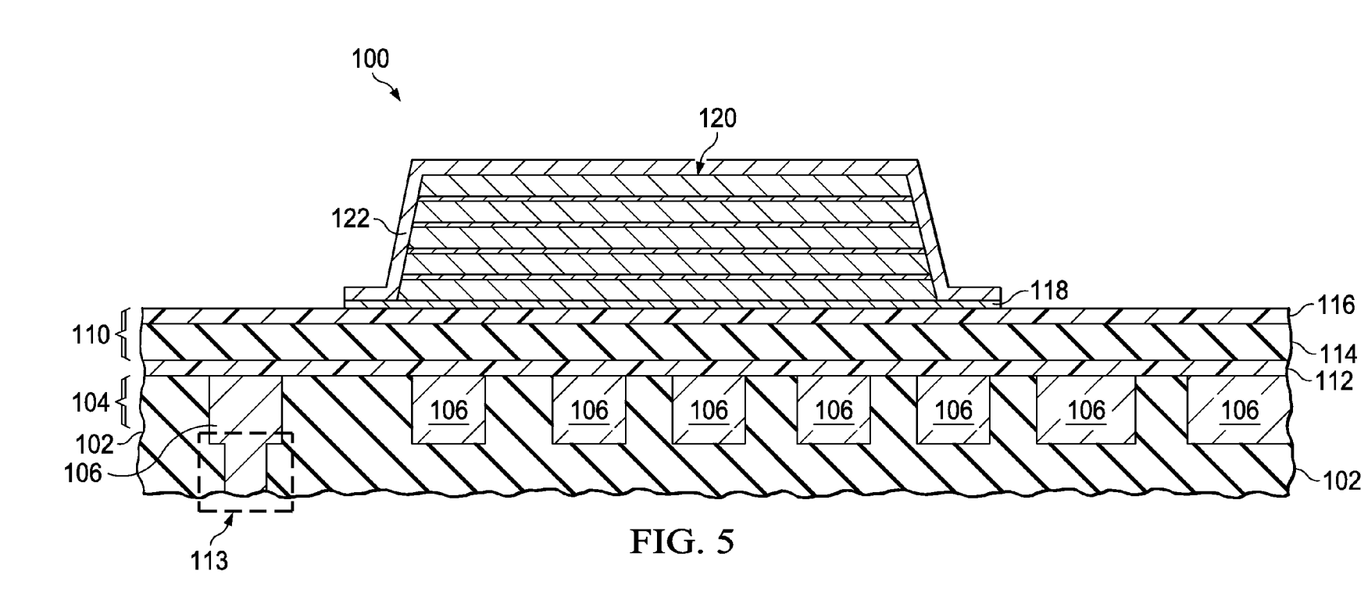
FIG. 5 is a cross section of a magnetic core encapsulated with a stress relief layer.

Referring to FIG. 5, encapsulation of the magnetic core 120 with an underlying stress relief layer 118 and/or an overlying stress relief layer 122 may improve yield by eliminating delamination of the magnetic core 120 from the surrounding dielectric layers 110 and 124 due to stress.

Figure 6A:
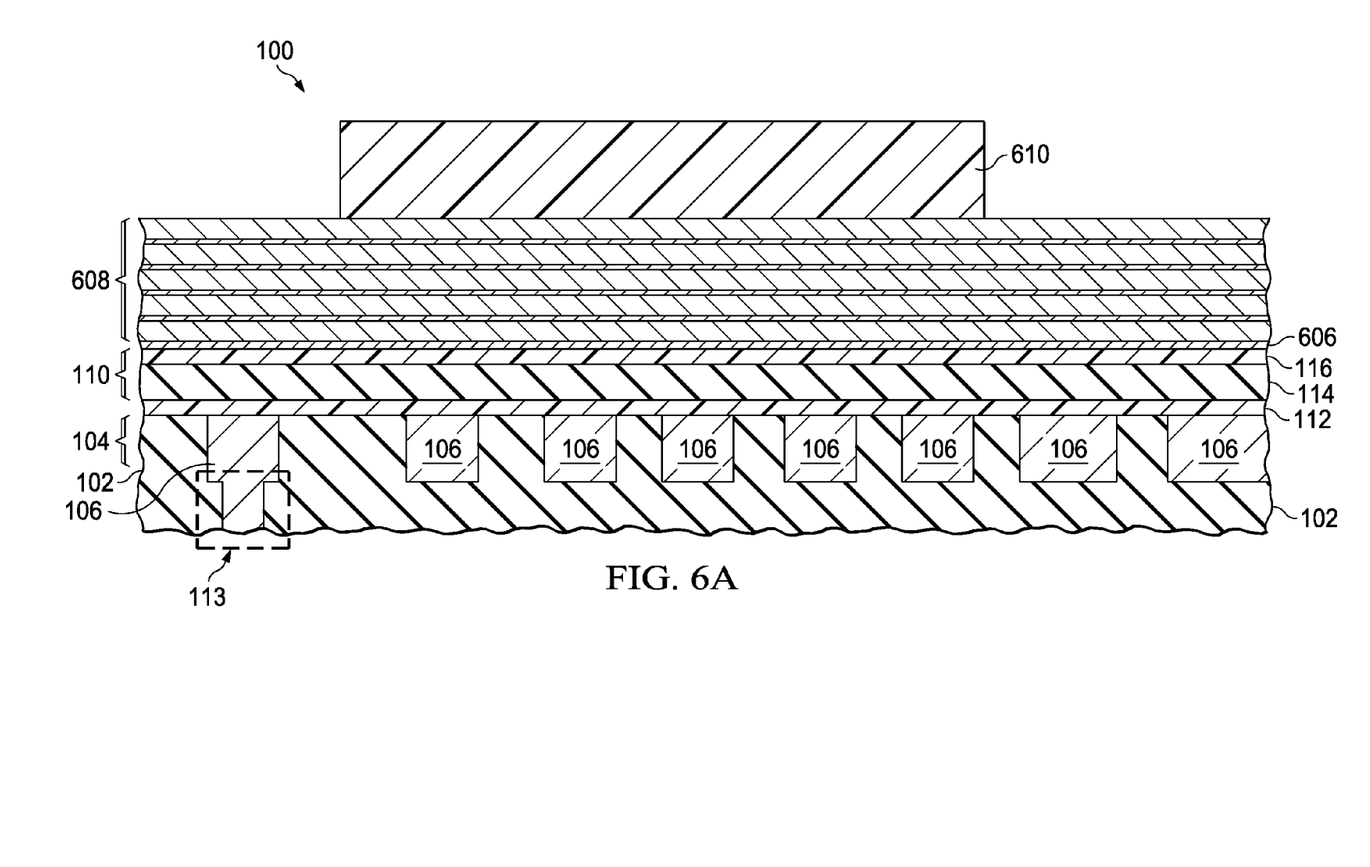
Figure 6B:
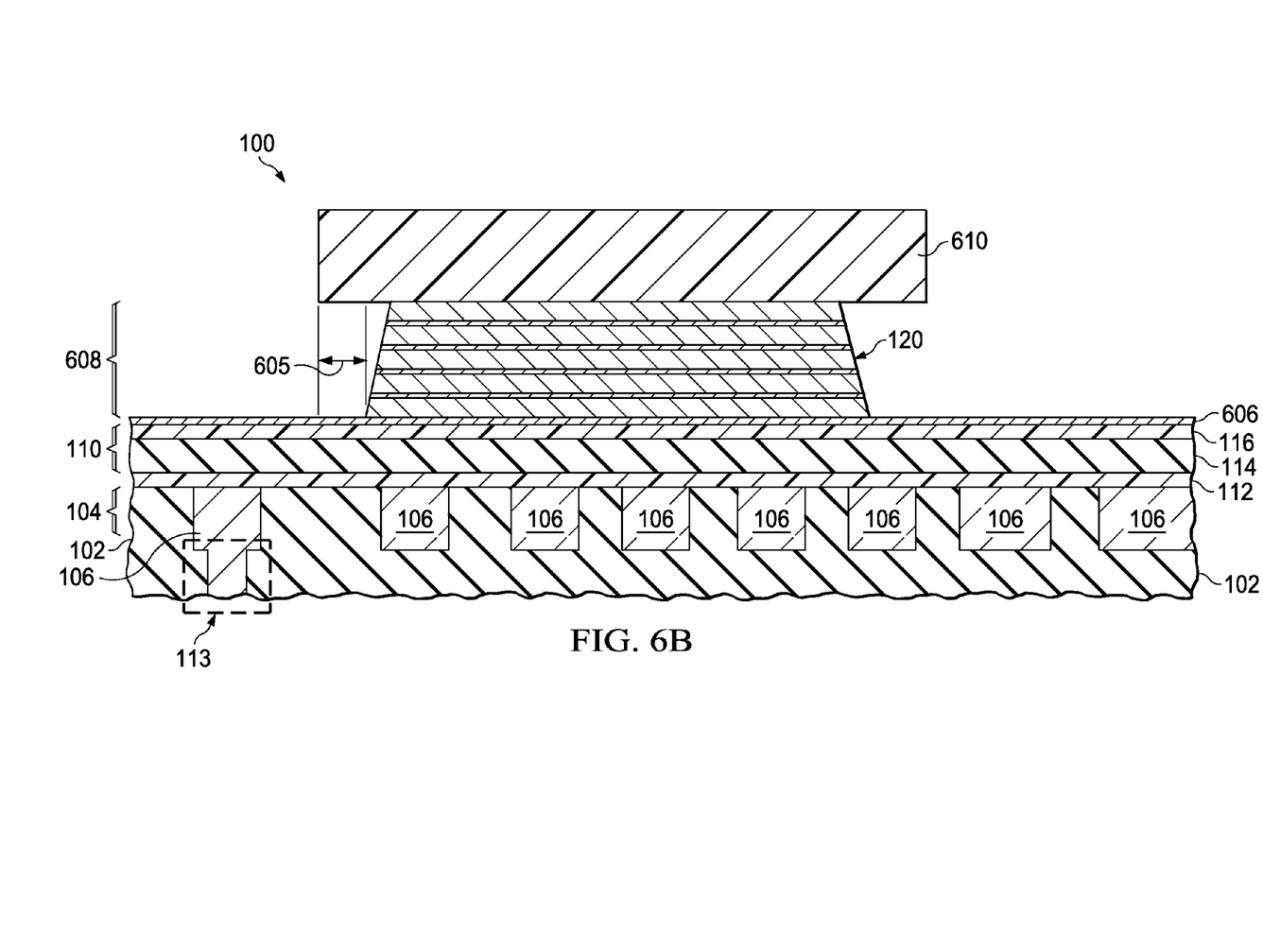
Figure 6C:
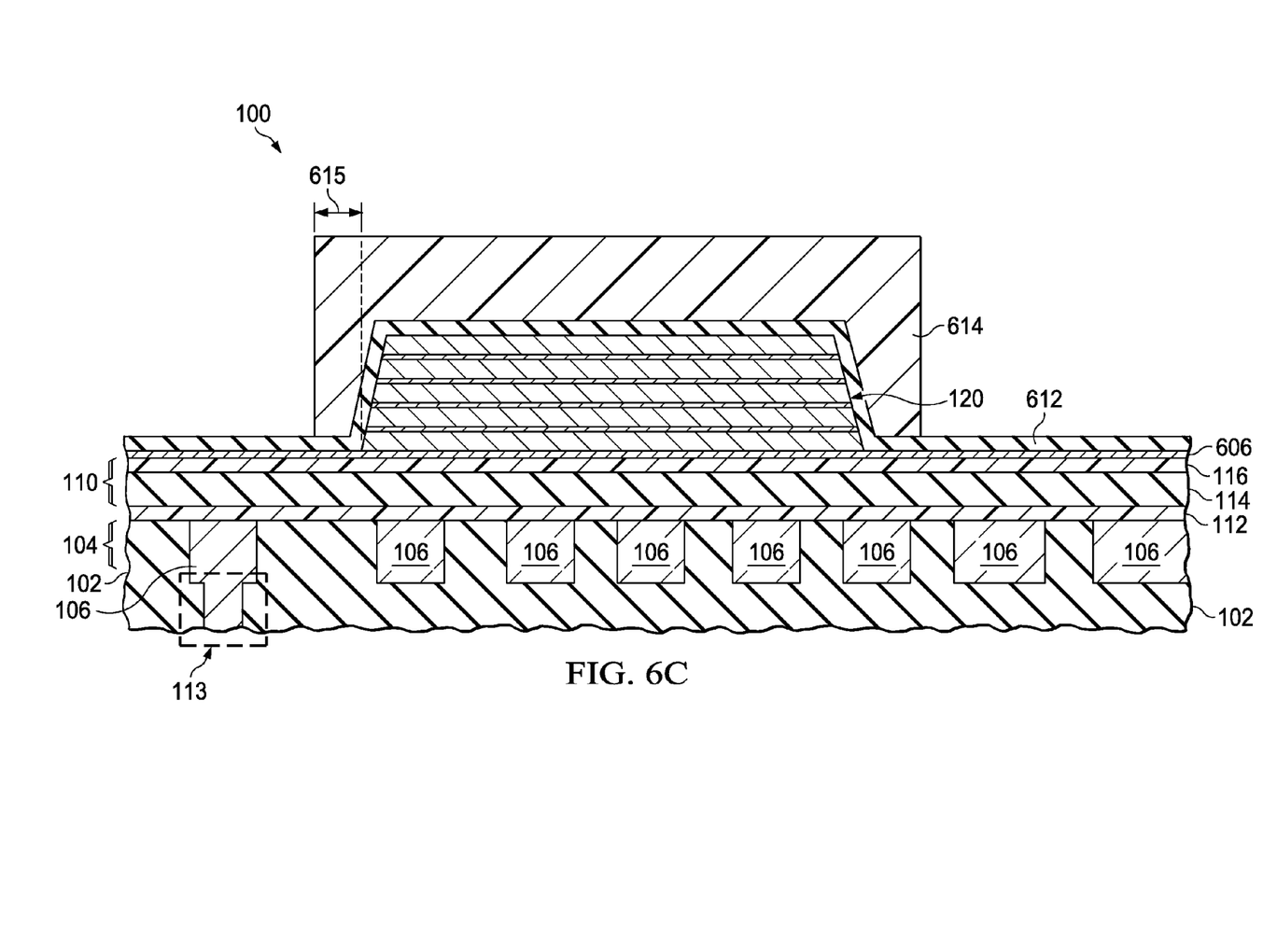

FIG. 6A through FIG. 6C are cross sections of the integrated circuit of FIG. 5 depicted in successive stages of fabrication.

Referring to FIG. 6A a first layer of stress relief material layer 606 such as titanium is deposed on etch stop layer 116. Other stress relief materials such as Ta, TiN, TaN, Ru, and Pt may be used. Titanium is used for illustration. For this embodiment etch stop layer 116 is not optional. It provides etch stop selectivity to a subsequent plasma etch containing fluorine. The titanium layer 606 may be deposited using physical vapor deposition (PVD) such as sputtering to a thickness between about 30 nm to 50 nm.

The magnetic core material layer 608 is formed on the stress relief material layer 606 as described previously. A magnetic core pattern 610 is formed on the magnetic core material layer 608.

Referring to FIG. 6B the wet etchant is used to etch away the magnetic core material 608 where exposed by the magnetic core pattern 610. The amount of undercut 605 of the magnetic core pattern 610 at the bottom of the magnetic core 120 may be controlled with the wet etch over etch time. It is advantageous for the stress relief layer 606 to extend beyond the magnetic core 120 by at least about 1.5 microns to provide sufficient mechanical stability to eliminate delamination that might lead to circuit failure. The wafers may remain in the wet etchant bath so that the magnetic core pattern extends a length 605 of at least 1.5 microns beyond the bottom of the magnetic core 120. This enables the photo mask that forms the magnetic core pattern 610 to be reused to form a stress relief material etch pattern 614 saving considerable cost.

Referring now to FIG. 6C the magnetic core pattern 610 is removed and a second layer of stress relief material 612 such as titanium may be formed over the first stress relief material layer 606 and over the top and sides of the magnetic core 120. The titanium layer 612 may be deposited using physical vapor deposition (PVD) such as sputtering to a thickness between about 90 nm to 300 nm.

A stress relief material etch pattern 614 is formed on the second stress relief layer 612. The same photomask that was used to form the magnetic core pattern 610 may be used to form stress relief material etch pattern 614. The stress relief material etch pattern 614 extends a length 615 of at least 1.5 microns 615 past the base of the magnetic core 120.

The second titanium layer 612 and the first titanium layer 606 exposed by the stress relief material etch pattern 614 are etched using a plasma etch containing fluorine gas to form the structure in FIG. 5. The plasma etch stops on etch stop layer 116. Extending the first and second stress relief layers at least 1.5 microns beyond the edges of the magnetic core provides sufficient mechanical stability to prevent delamination of the magnetic core 120 from the surrounding dielectric layers 116 and 124 which may introduce noise reducing the sensitivity of the flux magnetometer and also may result in circuit failure.

The fabrication of the integrated circuit 100 is then continued to provide a fluxgate magnetometer structure 111 similar to that shown in FIG. 1 with the addition of stress relief encapsulation.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps:
    forming a first dielectric layer on a wafer of the integrated circuit;
    forming a layer of magnetic core material composed of alternating layers of NiFe permalloy and AlN dielectric on the first dielectric layer;
    forming a magnetic core pattern on the magnetic core material which exposes areas outside a magnetic core area;
    etching with a wet etchant to remove the magnetic core material where exposed by the magnetic core pattern to form a magnetic core wherein the wet etchant is comprised of phosphoric acid, acetic acid, nitric acid and deionized water; and
    removing the magnetic core pattern.

2. The method of claim 1, wherein the phosphoric acid is concentrated phosphoric acid with a weight percent between 10% and 40%, the acetic acid is concentrated acetic acid with a weight percent between 1% and 10%, and the nitric acid is concentrated nitric acid with a weight percent between 0.1% and 3%.

3. The method of claim 1, wherein each layer of NiFe permalloy has a thickness between 225 nm and 425 nm and where each layer of AlN has a thickness between 5 nm and 15 nm and where there are between 3 and 10 layers each of NiFe permalloy and AlN.

4. The method of claim 1 wherein each layer of NiFe permalloy has a thickness of 325 nm and each layer of AlN has a thickness of 10 nm.

5. The method of claim 1, wherein the step of etching with the wet etchant comprises repeated cycles of etching the magnetic core material with the wet etchant followed by a deionized water rinse until the magnetic material is removed from the exposed areas.

6. The method of claim 1, wherein the step of etching with a wet etch comprises repeated cycles of etching the magnetic core material with the wet etchant for a time less than 6 minutes followed by a deionized water rinse until the magnetic material is removed from the exposed areas.

7. The method of claim 1, wherein the wet etchant is comprised of 30% by weight concentrated phosphoric acid, 4% by weight concentrated acetic acid, 0.45% by weight concentrated nitride acid, and deionized water.

8. A method of forming an integrated circuit, comprising the steps:
    forming a first dielectric layer on a wafer of the integrated circuit;
    forming an etch stop layer on the first dielectric layer wherein the etch stop layer is silicon nitride;
    forming a first stress relief material layer on the etch stop layer;
    forming a layer of magnetic core material composed of alternating layers of NiFe permalloy and AlN dielectric on the stress relief material layer;
    forming a magnetic core pattern on the magnetic core material which exposes areas outside a magnetic core and where the magnetic core pattern is formed using a photomask;
    etching with a wet etchant to remove the magnetic core material where exposed by the magnetic core pattern to form the magnetic core wherein the wet etchant is comprised of phosphoric acid, acetic acid, nitric acid and deionized water;
    overetching the magnetic core material so that the magnetic core pattern extends beyond the bottom of the magnetic core by at least 1.5 um;
    removing the magnetic core pattern;
    forming a second stress relief material layer on the first stress relief material layer and on the top and sides of the magnetic core;
    forming a stress relief material etch pattern on the second stress relief material wherein the stress relief material etch pattern extends beyond the bottom of the magnetic core by at least 1.5 um and wherein the stress relief material etch pattern is formed using the same photomask that is used to form the magnetic core pattern;
    etching the first and the second stress relief material layers using a plasma etch with a fluorine containing gas wherein the plasma etch stops on the etch stop layer; and
    removing the stress relief material etch pattern.

9. The method of claim 8, wherein the phosphoric acid is concentrated phosphoric acid with a weight percent between 10% and 40%, the acetic acid is concentrated acetic acid with a weight percent between 1% and 10%, and the nitric acid is concentrated nitric acid with a weight percent between 0.1% and 3%.

10. The method of claim 8, wherein the wet etchant comprises 30% by weight concentrated phosphoric acid, 4% by weight concentrated acetic acid, 0.45% concentrated nitric acid, and DI water.

11. The method of claim 8, wherein the first stress relief material has a thickness of between 30 nm and 50 nm and where the second stress relief layer has a thickness between 90 nm and 300 nm.

12. The method of claim 8, wherein each layer of NiFe permalloy has a thickness between 225 nm and 425 nm and where each layer of AlN has a thickness between 5 nm and 15 nm and where there are between 3 and 10 layers each of NiFe permalloy and AlN.

13. The method of claim 8, wherein the first and second stress relief layers are selected from the group consisting of Ti, TiN, Ta, TaN, Ru, and Pt.

14. The method of claim 8, wherein the first stress relief layer is titanium with a thickness between 30 nm and 50 nm and wherein the second stress relief layer is titanium with a thickness between 90 nm and 300 nm.

15. The method of claim 8, wherein the step of etching with the wet etchant comprises repeated cycles of etching the magnetic core material with the wet etchant followed by a deionized water rinse until the magnetic material is removed from the exposed areas.

16. The method of claim 8, wherein the step of etching with a wet etch comprises repeated cycles of etching the magnetic core material with the wet etchant for a time less than 6 minutes followed by a deionized water rinse until the magnetic material is removed from the exposed areas.

17. The method of claim 8, wherein the etch stop layer is silicon nitride formed by PECVD using silane, ammonia, and nitrogen gases with a thickness between 35 nm and 150 nm.

* * * * *